United States Patent
Nomoto et al.

(10) Patent No.: US 10,084,211 B2
(45) Date of Patent: Sep. 25, 2018

(54) FLEXIBLE PRINTED CIRCUIT WITH BUS BARS, MANUFACTURING METHOD THEREOF, AND BATTERY SYSTEM

(71) Applicant: Nippon Mektron, Ltd., Tokyo (JP)

(72) Inventors: Hiroshi Nomoto, Ushiku (JP); Koichiro Yoshizawa, Ushiku (JP)

(73) Assignee: NIPPON MEKTRON, LTD., Tokyo (JP)

( * ) Notice: Subject to any disclaimer, the term of this patent is extended or adjusted under 35 U.S.C. 154(b) by 214 days.

(21) Appl. No.: 14/370,325

(22) PCT Filed: Aug. 27, 2013

(86) PCT No.: PCT/JP2013/072790
§ 371 (c)(1),
(2) Date: Jul. 2, 2014

(87) PCT Pub. No.: WO2014/064997
PCT Pub. Date: May 1, 2014

(65) Prior Publication Data
US 2014/0370343 A1    Dec. 18, 2014

(30) Foreign Application Priority Data
Oct. 23, 2012    (JP) .................................. 2012-233885

(51) Int. Cl.
*H01M 10/42*        (2006.01)
*H05K 1/02*         (2006.01)
(Continued)

(52) U.S. Cl.
CPC ..... *H01M 10/4257* (2013.01); *H01M 2/1077* (2013.01); *H01M 2/206* (2013.01);
(Continued)

(58) Field of Classification Search
CPC ........... H01M 10/4207; H01M 10/425; H01M 10/4257; H01M 10/482; H01M 2/1077;
(Continued)

(56) References Cited

U.S. PATENT DOCUMENTS

| 5,666,040 A * | 9/1997 | Bourbeau ............. H01M 2/348 320/118 |
| 2002/0031700 A1* | 3/2002 | Wruck .................... H01M 2/28 429/61 |

(Continued)

FOREIGN PATENT DOCUMENTS

| CN | 101395739 A | 3/2009 |
| CN | 102307428 A | 1/2012 |

(Continued)

OTHER PUBLICATIONS

Chinese Office Action dated Nov. 16, 2015 issued in Chinese Patent Application No. 201380006241.0 filed Aug. 27, 2013 (with English translation).

(Continued)

*Primary Examiner* — Lingwen R Zeng
(74) *Attorney, Agent, or Firm* — Jacobson Holman, PLLC.

(57) ABSTRACT

To be small-sized/light in weight, and to easily cope with the variation of an inter-electrode pitch of battery cells. A flexible printed circuit with bus bars of one embodiment includes a flexible printed wiring board having a flexible insulating base material and a plurality of wiring patterns provided on one main surface of the flexible insulating base material and provided with land parts for bus bar connection at one end, and a plurality of bus bars and fixed to the land parts for the bus bar connection with an adhesive. The plurality of bus bars and are electrically connected to the respectively corresponding land parts for the bus bar con- (Continued)

nection in block by a plating layer formed on the bus bar and the land part for the bus bar connection.

5 Claims, 10 Drawing Sheets

(51) Int. Cl.
    *H05K 3/10*     (2006.01)
    *H01M 2/10*     (2006.01)
    *H01M 2/20*     (2006.01)
    *H01M 10/48*     (2006.01)

(52) U.S. Cl.
    CPC ..... *H01M 10/425* (2013.01); *H01M 10/4207* (2013.01); *H05K 1/0278* (2013.01); *H05K 1/0296* (2013.01); *H05K 3/10* (2013.01); *H01M 10/482* (2013.01); *Y10T 29/49147* (2015.01)

(58) Field of Classification Search
    CPC ... H01M 2/206; H05K 1/0278; H05K 1/0296; H05K 3/10; Y10T 29/49147
    See application file for complete search history.

(56) References Cited

U.S. PATENT DOCUMENTS

2003/0215702 A1* 11/2003 Tanjou .............. H01M 10/4207
    429/127

2010/0203378 A1   8/2010   Narbonne et al.
2010/0271223 A1* 10/2010   Ohkura ................ H01M 2/34
    340/636.13

FOREIGN PATENT DOCUMENTS

| CN | 102484385 A | 5/2012 |
|---|---|---|
| JP | 55-145390 A | 11/1980 |
| JP | 56-70655 A | 6/1981 |
| JP | 60-10798 A | 1/1985 |
| JP | 3707595 B2 | 10/2005 |
| JP | 2009-117149 A | 5/2009 |
| JP | 2010-003627 A | 1/2010 |
| JP | 2012-056035 A | 3/2010 |
| JP | 2011-210711 A | 10/2011 |
| JP | 2011/228217 A | 11/2011 |
| WO | 2011/052699 A1 | 5/2011 |
| WO | 2011/157693 A1 | 12/2011 |
| WO | 2012/131809 A1 | 10/2012 |
| WO | 2012/133592 A1 | 10/2012 |

OTHER PUBLICATIONS

Japanese Office Action Decision of Rejection, dated Aug. 5, 2016, with English Translation (5 pages).
Japanese Office Action "Notification of Reason for Rejection", dated May 6, 2016, in connection with Japanese Patent Application No. 2012-233885, with English translation.
Japanese Reconsideration Report, dated Jan. 6, 2017, with English Translation (5 pages).
Japanese Office Action and English translation dated Aug. 18, 2017.

* cited by examiner

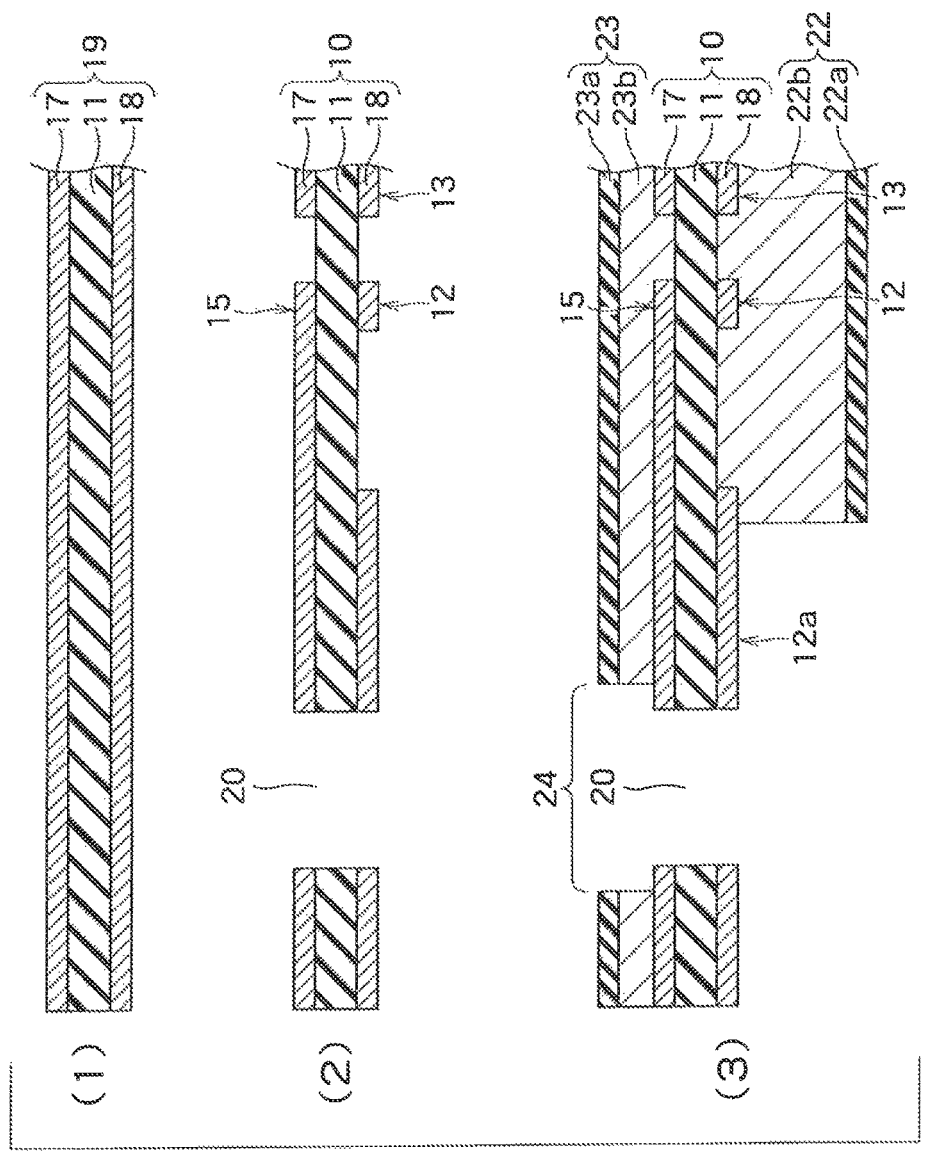

FLEXIBLE PRINTED CIRCUIT WITH BUS BARS, MANUFACTURING METHOD THEREOF, AND BATTERY SYSTEM

TECHNICAL FIELD

The present invention relates to a flexible printed circuit with bus bars, a manufacturing method thereof, and a battery system, and in more detail, a flexible printed circuit with bus bars to be assembled to a battery block formed by laminating a plurality of battery cells, a manufacturing method thereof, and a battery system including the flexible printed circuit with the bus bars.

BACKGROUND ART

As a power source of a vehicle such as an electric automobile or a hybrid automobile or electrical equipment, there is a battery system including a battery block composed of a plurality of battery cells (also called just "cells", hereinafter) and a circuit for monitoring the states (voltage, temperature) of the respective battery cells.

In the battery system, conventionally, as a cable which connects the battery cell and the monitoring circuit in order to monitor the states of the respective battery cells, a wire harness, a flexible flat cable (FFC) or a rigid substrate is used.

In Patent Literature 1 and Patent Literature 2, a battery device using a wire harness is disclosed. In Patent Literature 3, a battery module using a flexible flat cable is disclosed. In Patent Literature 4, a battery system using a rigid substrate is disclosed.

Also, in Patent Literatures 3 and 5, electrically connecting a bus bar attached to an electrode of the battery cell to a wiring member of a flexible flat cable or the like by welding or screwing is disclosed.

CITATION LIST

Patent Literature

Patent Literature 1: Japanese Patent Laid-Open No. 2009-117149
Patent Literature 2: Japanese Patent Laid-Open No. 2010-3627
Patent Literature 3: Japanese Patent Laid-Open No. 2011-210711
Patent Literature 4: Japanese Patent Laid-Open No. 2010-56035
Patent Literature 5: Japanese Patent No. 3707595

SUMMARY OF INVENTION

Technical Problem

A conventional connection method of a battery cell and a monitoring circuit has the following problems.

In the case of connection using a wire harness, the number of components is large, assembly work is complicated, and the weight of the entire battery system becomes heavy.

In the case of connection using a flexible flat cable, in addition to the time and labor of folding the cable generated when assembling it to a battery block, it is difficult to provide a monitoring circuit on the flexible flat cable, and it is not easy to miniaturize the entire battery system.

In the case of connection using a rigid substrate, it is not easy to assemble the rigid substrate to a battery block due to variation of an inter-electrode pitch of the battery block or the like. In particular, it is obvious when the number of battery cells is large (several tens to hundreds) like a fuel cell.

Also, when electrically connecting bus bars to an FFC or the like one by one by screwing or welding, there is the problem that productivity declines as the number of battery cells increases.

The present invention has been made on the basis of the above-described technical recognitions, and has an object to provide a flexible printed circuit with bus bars, which is small-sized/light in weight, and is easy to assemble to a battery block without the decline of productivity even when the number of battery cells increases, a manufacturing method thereof, and a battery system.

Solution to Problem

A flexible printed circuit with bus bars according to one aspect of the present invention includes a flexible printed wiring board having a flexible insulating base material, and a plurality of wiring patterns provided on one main surface of the flexible insulating base material and provided with land parts for bus bar connection at one end, and a plurality of bus bars fixed to the land parts for the bus bar connection with an adhesive, and the plurality of bus bars are electrically connected to the respectively corresponding land parts for the bus bar connection in block by a plating layer formed on the bus bars and the land parts for the bus bar connection.

A manufacturing method of a flexible printed circuit with bus bars according to one aspect of the present invention is a manufacturing method of the flexible printed circuit with the bus bars to be assembled to a battery block formed by laminating a plurality of battery cells, and includes preparing a double-sided metal clad laminate having a flexible insulating base material and a first metal film and a second metal film provided respectively on a first main surface and a second main surface of the flexible insulating base material, forming a through-hole for electrical conduction passing through the double-sided metal-dad laminate in a thickness direction, carrying out electroplating treatment to the double-sided metal-clad laminate, forming a first plating layer on the first and second metal films and on an inner wall of the through-hole for electrical conduction, and electrically connecting the first metal film and the second metal film by the first plating layer, processing the first metal film of the double-sided metal-clad laminate and the first plating layer formed thereon, and forming a flexible printed wiring board having a plurality of wiring patterns provided with land parts for bus bar connection at one end, insulating and protecting the wiring patterns of the flexible printed wiring board with a flexible insulating cover material so as to expose at least a part of the land parts for the bus bar connection, fixing the bus bars for electrically connecting electrodes of the adjacent battery cells with each other to the respective land parts for the bus bar connection, and carrying out electroplating treatment of the flexible printed wiring board to which the plurality of bus bars are fixed, forming a second plating layer on the bus bars and an exposed surface of the land parts for the bus bar connection, and electrically connecting the bus bars and the land parts for the bus bar connection in block by the second plating layer.

A manufacturing method of a flexible printed circuit with bus bars according to one aspect of the present invention is a manufacturing method of the flexible printed circuit with bus bars to be assembled to a battery block formed by laminating a plurality of battery cells, and includes preparing a double-sided metal-clad laminate having a flexible insulating base material and a first metal film and a second metal film provided respectively on a first main surface and a second main surface of the flexible insulating base material, forming a through-hole for electrical conduction passing through the double-sided metal-clad laminate in a thickness direction, processing the first metal film of the double-sided metal-clad laminate, and forming a flexible printed wiring board having a plurality of wiring patterns provided with land parts for bus bar connection at one end, insulating and protecting the wiring patterns of the flexible printed wiring board with a flexible insulating cover material so as to expose at least a part of the land parts for the bus bar connection, fixing the bus bars for electrically connecting electrodes of the adjacent battery cells with each other to the respective land parts for the bus bar connection, and carrying out electroplating treatment of the flexible printed wiring board to which the plurality of bus bars are fixed, forming a plating layer on an inner wall of the through-hole for electrical conduction, the bus bars and an exposed surface of the land parts for the bus bar connection, electrically connecting the first metal film and the second metal film and electrically connecting the bus bars and the land parts for the bus bar connection in block by the plating layer.

A manufacturing method of a flexible printed circuit with bus bars according to one aspect of the present invention is a manufacturing method of the flexible printed circuit with bus bars to be assembled to a battery block formed by laminating a plurality of battery cells, and includes preparing a one-sided metal-clad laminate having a flexible insulating base material and a metal film provided on one main surface of the flexible insulating base material, processing the metal film of the one-sided metal-clad laminate, and forming a flexible printed wiring board having a plurality of wiring patterns provided with land parts for bus bar connection at one end, insulating and protecting the wiring patterns of the flexible printed wiring board with a flexible insulating cover material so as to expose at least a part of the land parts for the bus bar connection, fixing the bus bars for electrically connecting electrodes of the adjacent battery cells with each other to the respective land parts for the bus bar connection, and carrying out electroplating treatment of the flexible printed wiring board to which the plurality of bus bars are fixed, forming a plating layer on the bus bars and an exposed surface of the land parts for the bus bar connection, and electrically connecting the bus bars and the land parts for the bus bar connection in block by the plating layer.

Advantageous Effects of Invention

According to the present invention, a flexible printed circuit with bus bars, which is small-sized/light in weight and can be easily assembled to a battery block, can be provided.

BRIEF DESCRIPTION OF DRAWINGS

FIG. 5A is a process cross sectional view for describing a different manufacturing method of the flexible printed circuit with bus bars according to the first embodiment of the present invention.

DESCRIPTION OF EMBODIMENTS

Hereinafter, embodiments and modifications of the present invention will be described with reference to the drawings. Also, the same symbols are attached to components having the same function in the respective drawings, and detailed descriptions for the components of the same symbol are not repeated.

First Embodiment

A flexible printed circuit 1 with bus bars (hereinafter, also called an "FPC with bus bars") according to a first embodiment of the present invention will be described with reference to FIG. 1 and FIG. 2.

Figure 1:
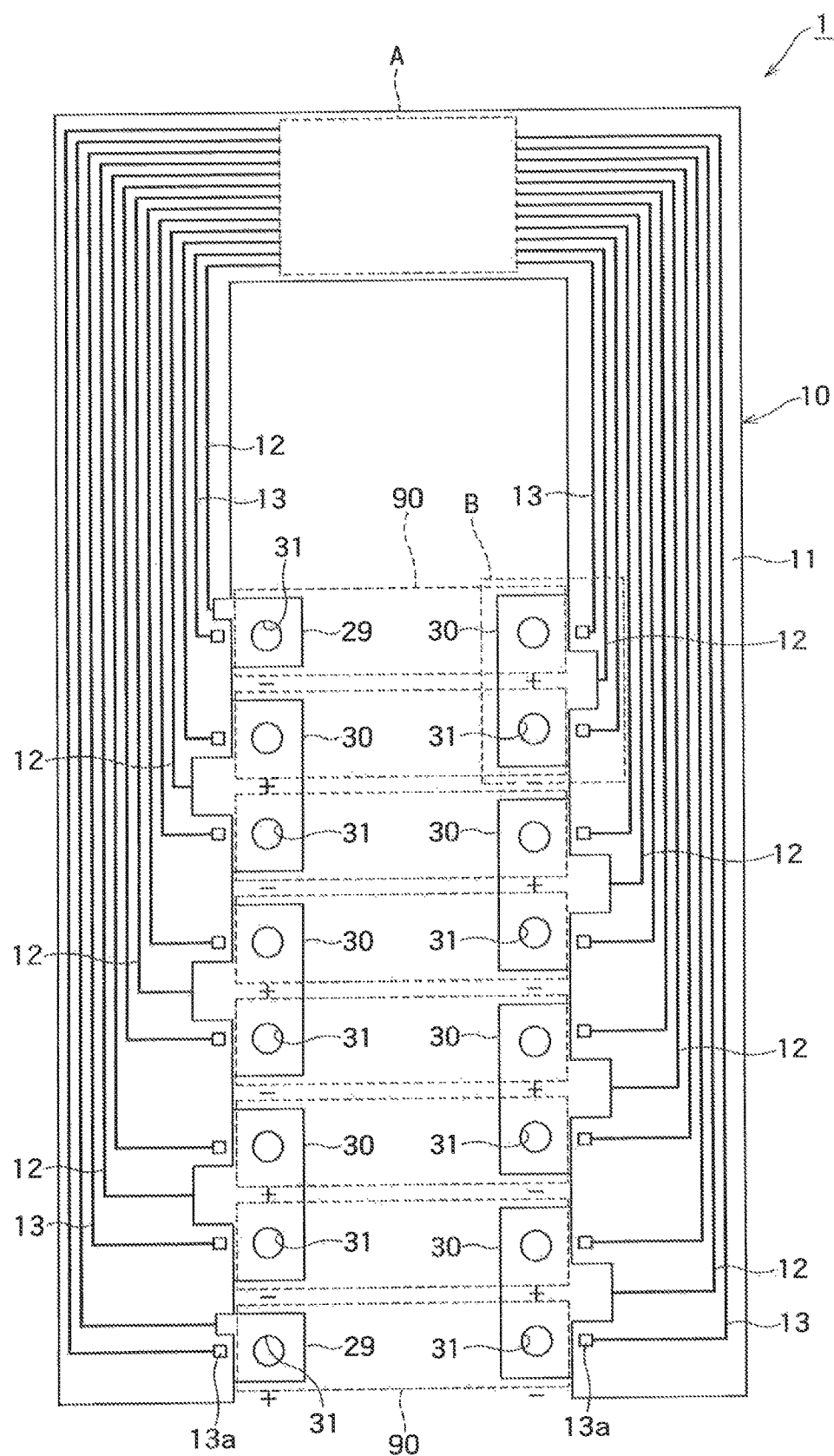
FIG. 1 is a plan view of a flexible printed circuit with bus bars, according to a first embodiment of the present invention.

FIG. 1 illustrates a plan view of the FPC 1 with bus bars, according to the first embodiment. FIG. 2 illustrates a plan view in which an area B in FIG. 1 is enlarged.

Figure 2:
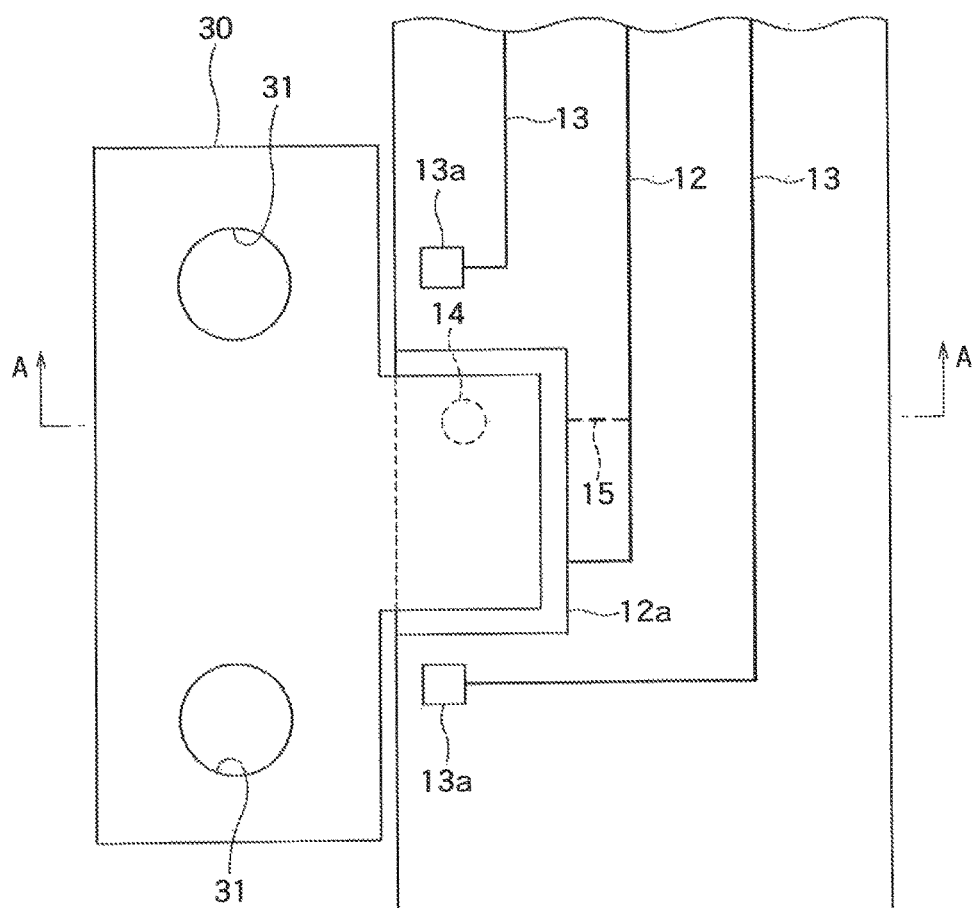
FIG. 2 is a plan view in which a part (area B) of the flexible printed circuit with bus bars according to the first embodiment of the present invention is enlarged.
Figure 7:
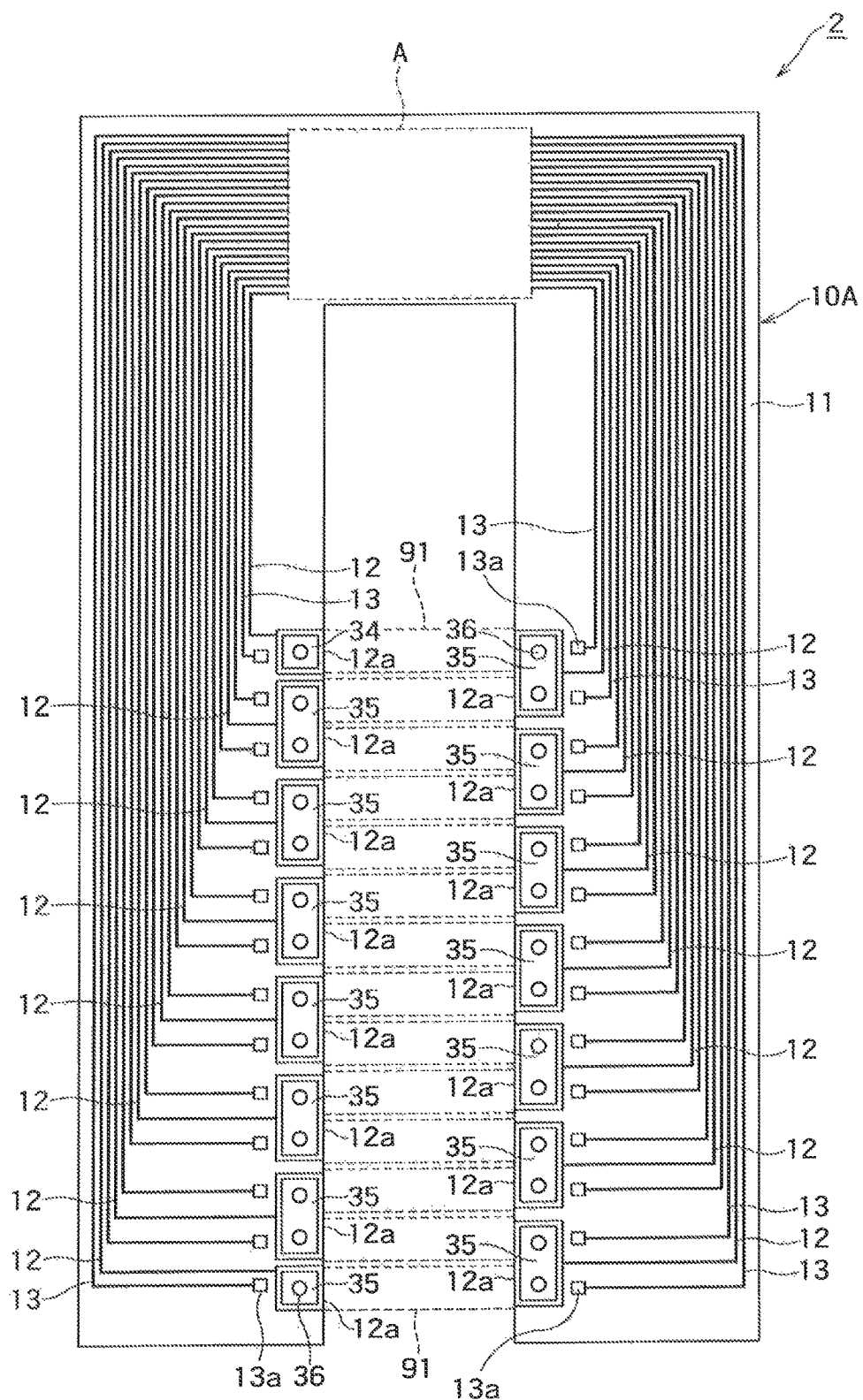
FIG. 7 is a plan view of a flexible printed circuit with bus bars, according to a second embodiment of the present invention.
Figure 8:
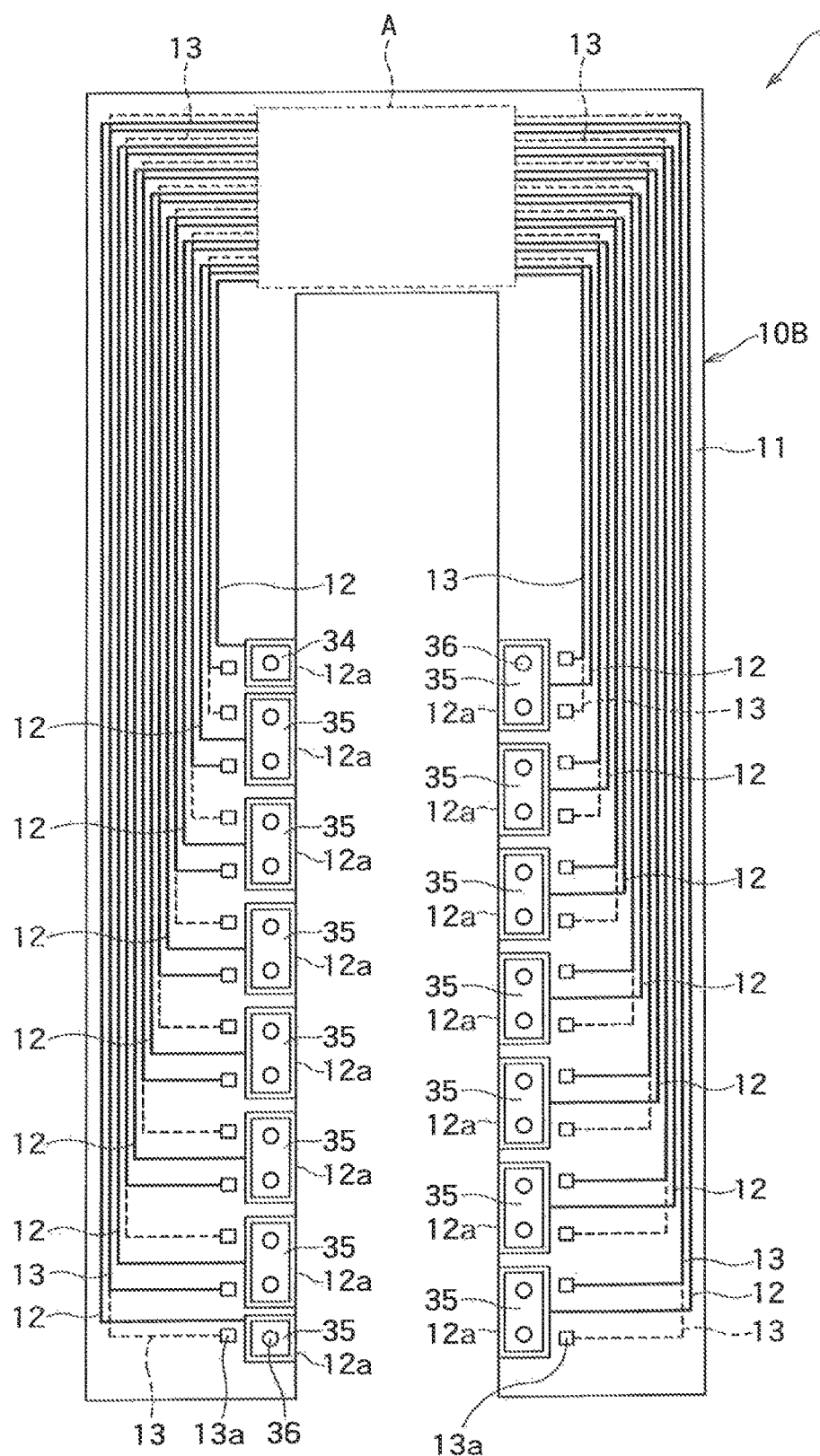
FIG. 8 is a plan view of a flexible printed circuit with bus bars, according to a modification of the second embodiment of the present invention.

Also, in FIG. 1 and FIG. 2, a cover lay 22 which insulates and protects wiring patterns 12 and 13, and a plating layer 33 which electrically connects bus bars 29 and 30 and a land part 12a for bus bar connection are not displayed (it is similar for FIG. 7 and FIG. 8 as well). The components will be described in detail using a process cross sectional view described later.

As illustrated in FIG. 1, the FPC 1 with the bus bars, according to this embodiment, is assembled to a battery block formed by laminating a plurality of battery cells 90. Each battery cell 90 has a positive electrode at one end and a negative electrode at the other end. The electrodes are projected as bolt-like ones from an upper surface of the battery cell. The battery block is formed by overlapping the plurality of battery cells 90 alternately in opposite directions, and the overlapped battery cells 90 are connected in series by the bus bars 30.

The FPC 1 with the bus bars illustrated in FIG. 1 is for the battery block (Li ion storage battery, for instance) formed by laminating 8 battery cells 90. The size of the FPC 1 with the bus bars depends on the size of the battery cells 90 and a lamination number or the like, and is vertically 400 mm (or 750 mm)×horizontally 250 mm, for instance.

The FPC 1 with the bus bars includes a flexible printed wiring board 10, and the plurality of bus bars 29 and 30 fixed to the flexible printed wiring board 10.

The flexible printed wiring board 10 includes a flexible insulating base material 11, and a plurality of wiring patterns provided on one main surface (upper surface) of the flexible insulating base material 11. For the wiring patterns, there are a wiring pattern 12 for measuring a voltage of the battery cell 90, a duplexed wiring pattern (sometimes simply called a "wiring pattern", hereinafter) 15, and a wiring pattern 13 for measuring a temperature of the battery cell 90.

Also, for the flexible insulating base material, the one known as a base material of the flexible printed wiring board is usable, and for instance, polyamide, polyimide, polyethylene naphthalate (PEN), or polyethylene terephthalate (PET) or the like is applicable.

As illustrated in FIG. 1, on the flexible printed wiring board 10, a chip mounting area A is provided. The chip mounting area A is an area for mounting a semiconductor chip that monitors voltages and temperatures of the battery cells 90 collected through the wiring patterns 12 and 13.

The wiring pattern 12 has the land part 12a for the bus bar connection at one end as illustrated in FIG. 2.

In this embodiment, the wiring pattern for cell voltage measurement is duplexed in order to improve reliability. That is, as illustrated in FIG. 2, the flexible printed wiring board 10 has the plurality of duplexed wiring patterns 15 that are provided on the other main surface (lower surface) of the flexible insulating base material 11 and are for measuring the voltages of the battery cells 90.

The duplexed wiring pattern 15 is electrically connected with the land part 12a for the bus bar connection through a plating through-hole 14 at one end. Here, the plating through-hole 14 is provided on the flexible insulating base material 11 and electrically connects both surfaces of the flexible insulating base material 11. The other end of the duplexed wiring pattern 15 is electrically connected to a land part for chip mounting of the wiring pattern 12 by connection means such as a plating through-hole.

In such a manner, a part between the land part for the bus bar connection and the land part for the chip mounting is duplexed by the wiring pattern 12 and the duplexed wiring pattern 15. Therefore, even when one of them is disconnected, the voltage of the battery cell can be monitored.

The wiring pattern 13 has a temperature sensor mounting part 13a at one end. The temperature sensor mounting part 13a is provided near the land part 12a for the bus bar connection, and a temperature sensor (not shown in the figure) for measuring the temperature of the battery cell 90 is mounted thereon. Also, as illustrated in FIG. 1, the two wiring patterns 13 are provided on the left and right of one battery cell 90 and are duplexed.

On the other ends of the wiring patterns 12 and 13, the land part for the chip mounting (not shown in the figure) is provided. The land part for the chip mounting is provided near the chip mounting area A, and is electrically connected with a terminal of the semiconductor chip through solder. That is, the semiconductor chip which monitors the voltages (voltages/temperatures of cells) of the wiring patterns 12 and 13 is mounted on the land part for the chip mounting by solder.

Then, the bus bars 29 and 30 fixed to the flexible printed wiring board 10 will be described.

The bus bars 29 and 30 are formed of a metal such as copper, stainless steel or aluminum. On a surface of the bus bars, a plating film of tin or nickel or the like may be formed.

The bus bar 29 is a short bus bar for connecting the battery cell 90 at one end of the battery block, and has one hole 31.

The bus bar 30 is for electrically connecting electrodes of the adjacent battery cells 90 (that is, a positive pole of one cell and a negative pole of the other cell) with each other, and has two holes 31.

The bus bar 29 and the bus bar 30 are both fixed to the land parts 12a for the bus bar connection described later with an adhesive.

The bus bars 29 and 30 are electrically connected to the respectively corresponding land parts 12a for the bus bar connection in block, by a plating layer (a plating layer 33 in FIG. 3B) formed on the bus bars 29 and 30 and the land parts 12a for the bus bar connection.

When assembling the FPC 1 with the bus bars to the battery block, a bolt-like electrode of the battery cell 90 is inserted to the hole 31 of each bus bar and is fixed with a nut. In such a manner, the FPC 1 with the bus bars is assembled to the battery block such that the electrodes of the battery cells 90 are electrically connected to the bus bars 29 and 30.

The flexible printed circuit with the bus bars according to this embodiment is flexible so that it can be bent or twisted according to an electrode position of the battery cell or a shape of the battery block. Therefore, even when a pitch between the electrodes of the laminated battery cells varies, the variation of the pitch can be absorbed to some extent by bending. Also, even to the battery cell provided with the electrode on a side face, the FPC with the bus bars can be twisted and assembled.

Thus, the flexible printed circuit with the bus bars can be easily assembled to the battery block. In particular, it is suitable when the number of the battery cells is large like a secondary battery loaded on a vehicle.

Also, the flexible printed circuit with the bus bars according to this embodiment is constituted of the flexible printed wiring board, and is therefore lighter in weight than a wire harness or a rigid substrate.

Further, according to this embodiment, by providing the wiring pattern for cell voltage measurement on both surfaces of the flexible insulating base material and duplexing it, the cell voltage can be measured even when one wiring is disconnected, and reliability can be improved. In addition, by providing the duplexed wiring pattern on a back surface of the flexible insulating base material, an occupancy area of the wiring pattern is reduced, and the flexible printed circuit with the bus bars can be miniaturized.

Also, according to this embodiment, since a fine wiring pattern can be formed by applying a micro-fabrication technology of the flexible printed wiring board, even a large number of battery cells can be easily coped with, and the flexible printed circuit with the bus bars can be miniaturized.

By assembling the FPC 1 with the bus bars, that is mounted with the semiconductor chip for monitoring and the temperature sensor, to the battery block formed by laminating the plurality of battery cells 90 so that the electrodes of the battery cells 90 are electrically connected to the bus bars 29 and 30, a battery system is configured.

According to the battery system, since the semiconductor chip is mounted in the chip mounting area A, there is no need of separately providing a mounting board for the semiconductor chip. Also, as described before, the FPC 1 itself with the bus bars is small-sized and is light in weight. Therefore, the entire battery system can be miniaturized and made light in weight. The battery system according to this embodiment is suitable as a drive source of an electric automobile or a hybrid automobile or the like.

Figure 3A:
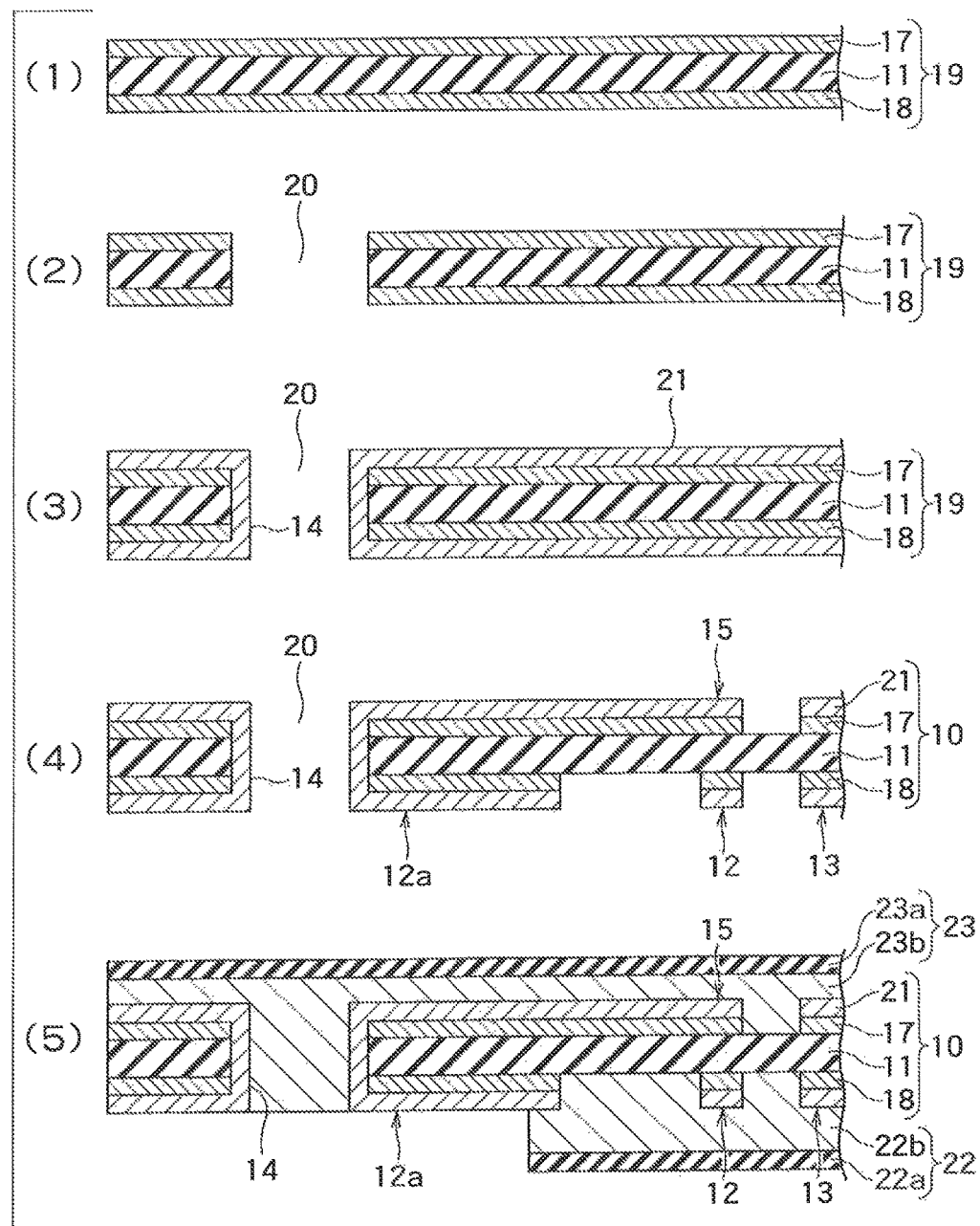
FIG. 3A is a process cross sectional view for describing a manufacturing method of the flexible printed circuit with bus bars according to the first embodiment of the present invention.
Figure 3B:
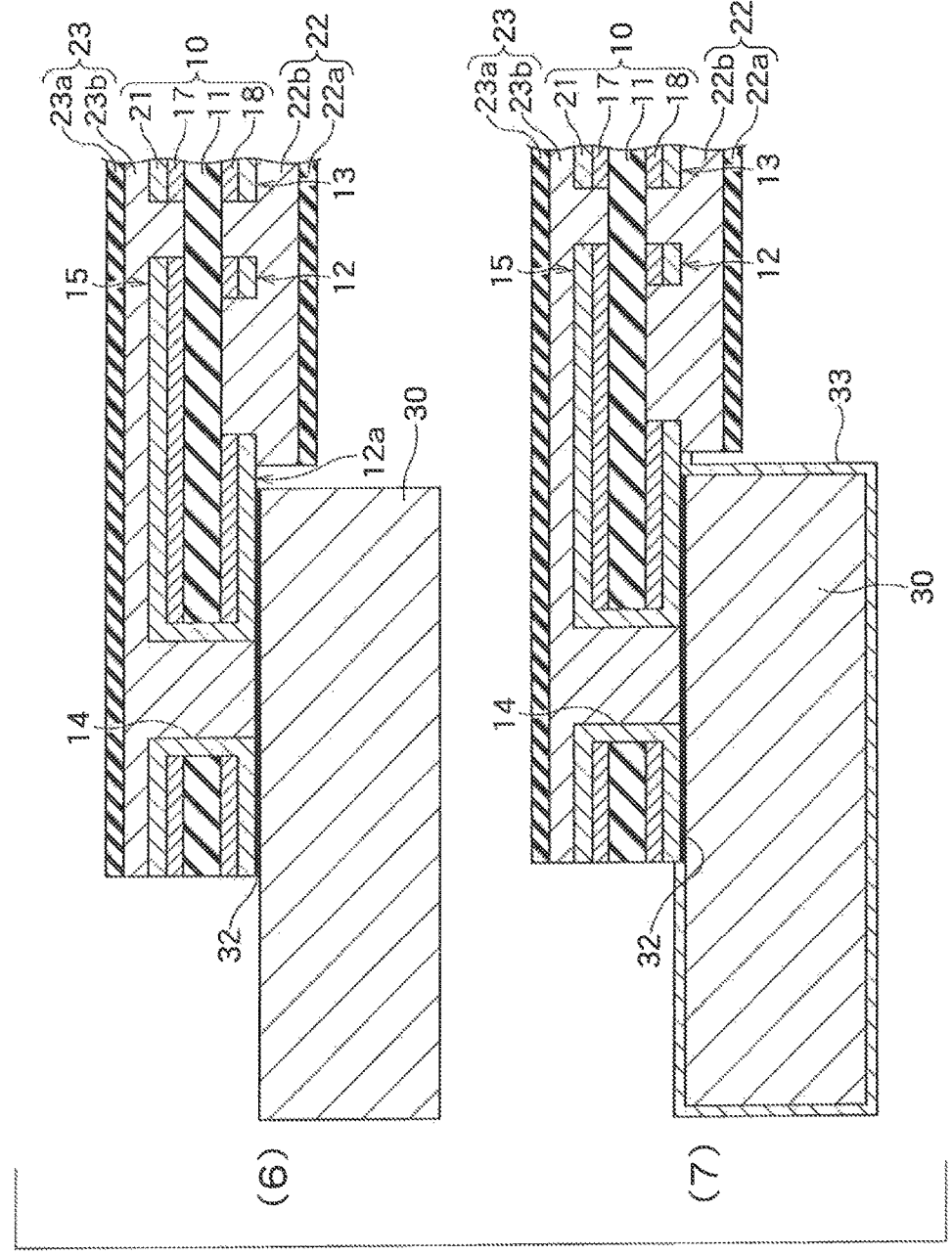
FIG. 3B is a process cross sectional view for describing a manufacturing method of the flexible printed circuit with bus bars according to the first embodiment of the present invention, following FIG. 3A.

Then, with reference to FIG. 3A and FIG. 3B, a manufacturing method of the FPC 1 with the bus bars according to this embodiment will be described. FIG. 3A and FIG. 3B illustrate a process cross sectional view for describing the manufacturing method of the FPC 1 with the bus bars according to the first embodiment. Also, FIG. 3A and FIG. 3B correspond to a cross section along the A-A' line in FIG. 2 (it is similar in FIG. 5A, FIG. 5B and FIG. 6).

First, a double-sided metal-clad laminate 19 is prepared. The double-sided metal-clad laminate 19 includes, as illustrated in FIG. 3A(1), the flexible insulating base material 11, and a metal film 18 and a metal film 17 provided respectively on a first main surface (lower surface) and a second main surface (upper surface) of the flexible insulating base material 11. The metal films 17 and 18 are not limited to the case of being directly formed on the flexible insulating base material 11, and may be provided on the flexible insulating base material 11 through an adhesive layer.

Also, the double-sided metal-clad laminate 19 is, preferably, a double-sided copper-clad laminate in which the metal films 17 and 18 are copper foil. However, the metal films 17 and 18 are not limited to the copper foil and may be thin films of other metals (for instance, silver or aluminum). Also, a thickness of the flexible insulating base material 11 is 25 μm for instance, and a thickness of the metal films 17 and 18 is 35 μm for instance, respectively.

Next, as illustrated in FIG. 3A(2), a through-hole for electrical conduction 20 that passes through the double-sided metal-clad laminate 19 in a thickness direction is formed. The through-hole for electrical conduction 20 is formed in a formation scheduled area of the land part 12a for the bus bar connection by mechanical punching or laser processing for instance.

Then, as illustrated in FIG. 3A(3), electroplating treatment of the double-sided metal-clad laminate 19 is carried out to form a plating layer 21 on the metal films 17 and 18 and on an inner wall of the through-hole for electrical conduction 20. By the plating layer 21, a plating through-hole 14 which electrically connects the metal film 17 and the metal film 18 is formed. Also, a thickness of the plating layer 21 is 15 μm to 25 μm for instance.

Subsequently, as illustrated in FIG. 3A(4), the metal film 18 of the double-sided metal-clad laminate 19 and the plating layer 21 formed thereon are processed to form the wiring patterns 12 and 13. Also, the metal film 17 of the double-sided metal-clad laminate 19 and the plating layer 21 formed thereon are processed to form the duplexed wiring pattern 15. Thus, the flexible printed wiring board 10 having the plurality of wiring patterns 12, 13 and 15 is formed.

Also, as a processing method of a conductive film composed of the metal films 17 and 18 and the plating layer 21, a known pattern forming method such as a subtractive method is usable.

Then, as illustrated in FIG. 3A(5), the wiring patterns 12 and 13 of the flexible printed wiring board 10 are insulated and protected by a flexible insulating cover material so as to expose at least a part of the land part 12a for the bus bar connection. Also, the duplexed wiring pattern 15 is insulated and protected by the flexible insulating cover material.

The wiring patterns 12 and 13 are insulated and protected by bonding a cover lay 22 to the first main surface (lower surface) of the flexible printed wiring board 10 by using a vacuum press or a vacuum laminator or the like, for instance. Similarly, the duplexed wiring pattern 15 is insulated and protected by bonding a cover lay 23 to the second main surface (upper surface) of the flexible printed wiring board 10 for instance.

The cover lay 22 is composed of an insulating film 22a (25 μm thickness, for instance), and an adhesive layer 22b formed on a surface thereof, and has openings or notched parts in areas corresponding to the land part 12a for the bus bar connection, the temperature sensor mounting part 13a and the land part for the chip mounting.

The cover lay 23 is composed of an insulating film 23a, and an adhesive layer 23b formed on a surface thereof.

The insulating films 22a and 23a are flexible insulating films of polyimide or the like, and the adhesive layers 22b and 23b are composed of an acrylic or epoxy-based adhesive, for instance.

Also, the flexible insulating cover material that insulates and protects the wiring patterns may be formed as a cover coat. That is, the wiring patterns may be insulated and protected by using a printing method such as screen printing and printing a resin in a prescribed area (for instance, an area where the wiring patterns are formed excluding the land parts) of the flexible printed wiring board 10.

Next, as illustrated in FIG. 3B(6), the bus bar 30 (29) is fixed to each of the land parts 12a for the bus bar connection. The bus bar 30 (29) is fixed using an adhesive. From the viewpoint of reducing contact resistance, it is preferable to use a conductive adhesive having conductivity as the adhesive. By this process, the bus bar 30(29) is fixed to each of the land parts 12a for the bus bar connection through an adhesive layer 32.

Also, in order to facilitate electrical connection by the plating layer 33 (described later) between the bus bar 30(29) and the land part 12a for the bus bar connection, it is preferable to fix the bus bar 30(29) so as to expose a part of the land part 12a for the bus bar connection as illustrated in FIG. 3B(6).

Next, as illustrated in FIG. 3B(7), electroplating treatment of the flexible printed wiring board 10 to which the plurality of bus bars 30(29) are fixed is carried out, and the plating layer 33 (15 μm to 25 μm thickness, for instance) is formed on the bus bar 30(29) and the exposed surface of the land part 12a for the bus bar connection. By the plating layer 33, the bus bar 30(29) and the land part 12a for the bus bar connection are electrically connected in block. That is, by the electroplating treatment, the plurality of bus bars 30(29) fixed to the corresponding land parts 12a for the bus bar connection are electrically connected in block.

Also, it is preferable that the plating layer 33 is formed of a material which is compatible with a connection opposite party (that is, the battery cell 90), such as copper (Cu), nickel (Ni) or tin (Sn).

The FPC 1 with the bus bars illustrated in FIG. 1 is obtained through the processes. Thereafter, the semiconductor chip which monitors the states (voltage and temperature or the like) of the cells is mounted in the chip mounting area A by solder, and the mounted semiconductor chip is sealed with a resin. Also, the temperature sensor is mounted on the temperature sensor mounting part 13*a*.

By the manufacturing method of the flexible printed circuit with the bus bars according to this embodiment, the plurality of bus bars 29 and 30 can be electrically connected to the flexible printed wiring board 10 in block by the electroplating treatment. In such a manner, since there is no need of electrically connecting the bus bars one by one, the productivity does not decline even when the number of the battery cells increases. Therefore, by this embodiment, the productivity can be improved, and a manufacturing cost of the flexible printed circuit with the bus bars can be reduced. The manufacturing method by this embodiment is suitable for a fuel cell with the large number of battery cells or the like for instance.

Also, it is preferable to perform the processes (FIGS. 3A(1)-(5)) until covering of the flexible printed wiring board 10 with the cover lays 22 and 23 by a roll-to-roll method, and thus the productivity can be improved further.

Further, it is preferable to fix the bus bars 29 and 30 after bonding the cover lay 22 to the flexible printed wiring board 10 as described above. Thus, it is possible to evade mixing-in of air bubbles between the cover lay 22 and the flexible printed wiring board 10 near the bus bar by the influence of the thickness (0.5 mm to 2 mm for instance) of the bus bar. However, the present invention does not exclude bonding of the cover lay 22 to the flexible printed wiring board 10 after fixing the bus bar.

Figure 4:
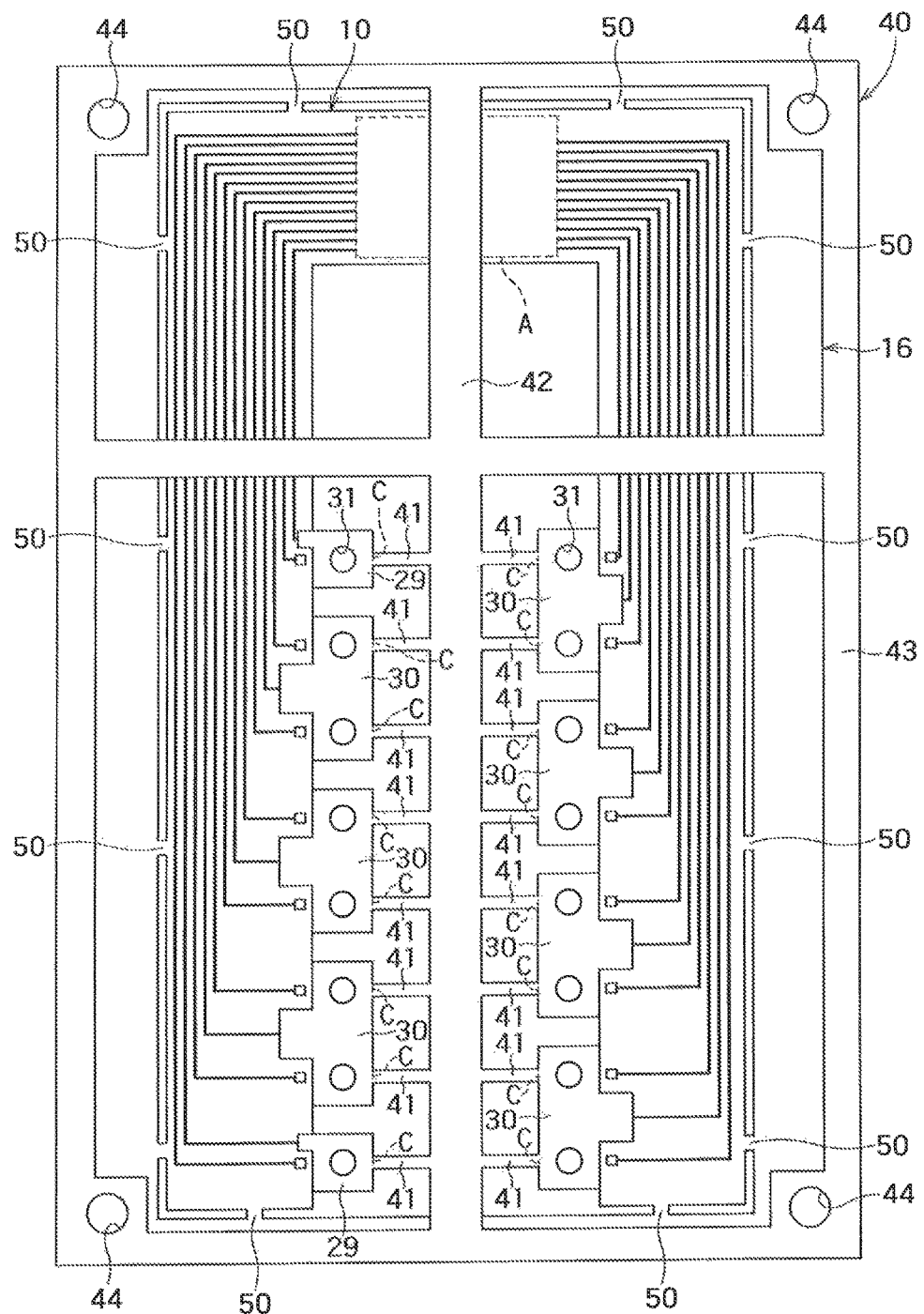
FIG. 4 is a plan view illustrating a state of attaching a bus bar frame to a flexible printed wiring board having an attachment target part.

The case of fixing the bus bars 29 and 30 using a frame (bus bar frame) including the plurality of bus bars will be described. FIG. 4 illustrates the state of attaching a bus bar frame 40 by one example to the flexible printed wiring board.

The bus bar frame 40 includes, as illustrated in FIG. 4, the plurality of bus bars 29 and 30, and a frame part 43 provided integrally with the plurality of bus bars 29 and 30 through connection parts 41 and 42.

The connection part 42 is provided in a cross shape so as to connect two opposite sides of the frame part 43. The connection part 41 is provided so as to connect the bus bars 29 and 30 and the connection part 42. Also, the frame part 43 is provided with a positioning hole 44 for attaching the bus bar frame 40 to the flexible printed wiring board in a positioned state.

As illustrated in FIG. 4, the flexible printed wiring board 10 is connected to a frame-like attachment target part 16 through a micro-joint 50. On four corners of the attachment target part 16, positioning holes (not shown in the figure) for positioning with the bus bar frame 40 are provided.

When using the bus bar frame 40, in the process of fixing the bus bars 29 and 30, the bus bar frame 40 and the flexible printed wiring board 10 are positioned so that the plurality of bus bars 29 and 30 are abutted to the respectively corresponding land parts 12*a* for the bus bar connection. The positioning is performed by inserting a pin to the positioning hole 44 of the frame part 43 and the positioning hole (not shown in the figure) of the attachment target part 16, for instance. Then, after performing the electroplating treatment of forming the plating layer 33, the bus bars 29 and 30 are cut off from the connection part 41 along a cutting line C illustrated in FIG. 4.

Thereafter, the micro-joint 50 is disconnected to cut off the flexible printed wiring board 10 from the attachment target part 16, and the FPC 1 with the bus bars is obtained.

As described above, by using the bus bar frame, the need of individually fixing the bus bars one by one is eliminated, and the productivity can be improved further. Also, compared to a poorly balanced and unstable state that the bus bars 29 and 30 are individually fixed, the state that the flexible printed wiring board 10 is fixed to the bus bar frame 40 is stable, so that handleability is excellent, and workability of the subsequent electroplating treatment or the like can be improved.

Next, with reference to FIG. 5A and FIG. 5B, another manufacturing method according to this embodiment will be described. In this manufacturing method, electroplating treatment processes are gathered into one. Detailed descriptions will be omitted for parts that overlap with the manufacturing method described above.

First, as illustrated in FIG. 5A(1), the double-sided metal-clad laminate 19 is prepared.

Next, as illustrated in FIG. 5A(2), the through-hole for electrical conduction 20 that passes through the double-sided metal-clad laminate 19 in the thickness direction is formed.

Subsequently, as illustrated in FIG. 5A(2), the metal film 18 of the double-sided metal-clad laminate 19 is processed to form the plurality of wiring patterns 12 and 13. Also, the metal film 17 of the double-sided metal-clad laminate 19 is processed to form the plurality of duplexed wiring patterns 15. Thus, the flexible printed wiring board 10 having the plurality of wiring patterns 12, 13 and 15 is formed.

Also, formation orders of the wiring patterns and the through-hole for electrical conduction are arbitrary. That is, the through-hole for electrical conduction 20 may be formed after forming the wiring patterns 12, 13 and 15.

Then, as illustrated in FIG. 5A(3), the wiring patterns 12 and 13 of the flexible printed wiring board 10 are insulated and protected by the flexible insulating cover material so as to expose at least a part of the land part 12*a* for the bus bar connection.

Also, as illustrated in FIG. 5A(3), the duplexed wiring pattern 15 of the flexible printed wiring board 10 is insulated and protected by the flexible insulating cover material so as to expose the through-hole for electrical conduction 20.

Further, the flexible insulating cover material which insulates and protects the wiring patterns may be a cover lay or a cover coat as described above.

Figure 5B:
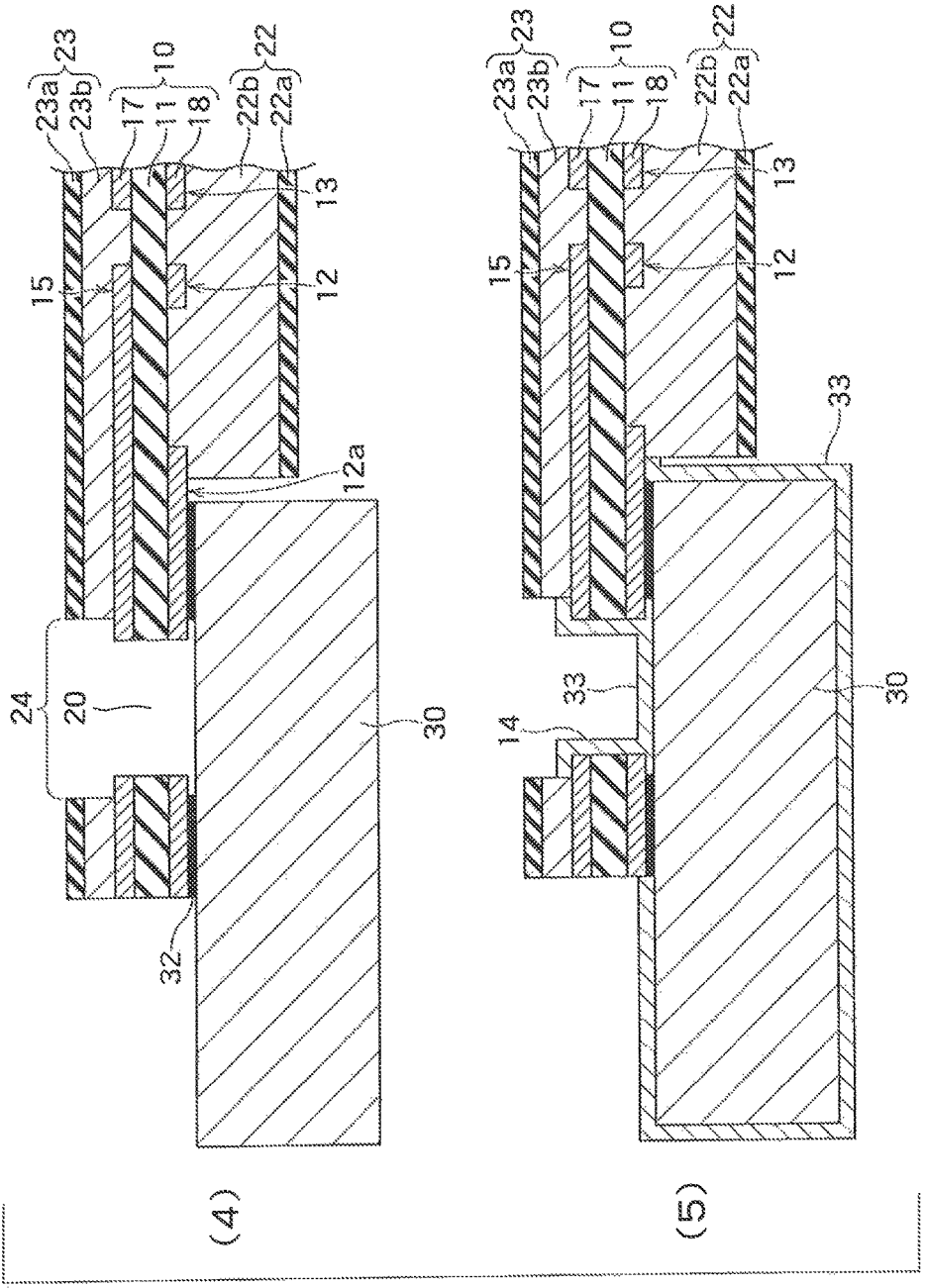
FIG. 5B is a process cross sectional view for describing a different manufacturing method of the flexible printed circuit with bus bars according to the first embodiment of the present invention, following FIG. 5A.

Then, as illustrated in FIG. 5B(4), the bus bar 30(29) is fixed to each of the land parts 12*a* for the bus bar connection.

Next, as illustrated in FIG. 5B(5), the electroplating treatment of the flexible printed wiring board 10 to which the plurality of bus bars 30(29) are fixed is carried out, and the plating layer 33 is formed on the inner wall of the through-hole for electrical conduction 20, the bus bar 30(29) and the exposed surface of the land part 12*a* for the bus bar connection.

By the plating layer 33, the metal film 17 and the metal film 18 are electrically connected (that is, the plating through-hole 14 is formed), and the bus bars 30(29) and the land parts 12*a* for the bus bar connection are electrically connected in block.

The FPC 1 with the bus bars illustrated in FIG. 1 can be obtained by the above-described processes as well. In the case of this method, since the electroplating treatment is performed once, a manufacturing process is shortened, and the productivity can be improved further.

(Modification of the First Embodiment)

Next, with reference to FIG. 6, a manufacturing method according to a modification of this embodiment will be described. In this modification, a one-sided metal-clad laminate 25 is used instead of the double-sided metal-clad laminate 19. This modification is applied when not providing the duplexed wiring pattern 15, for instance.

Figure 6:
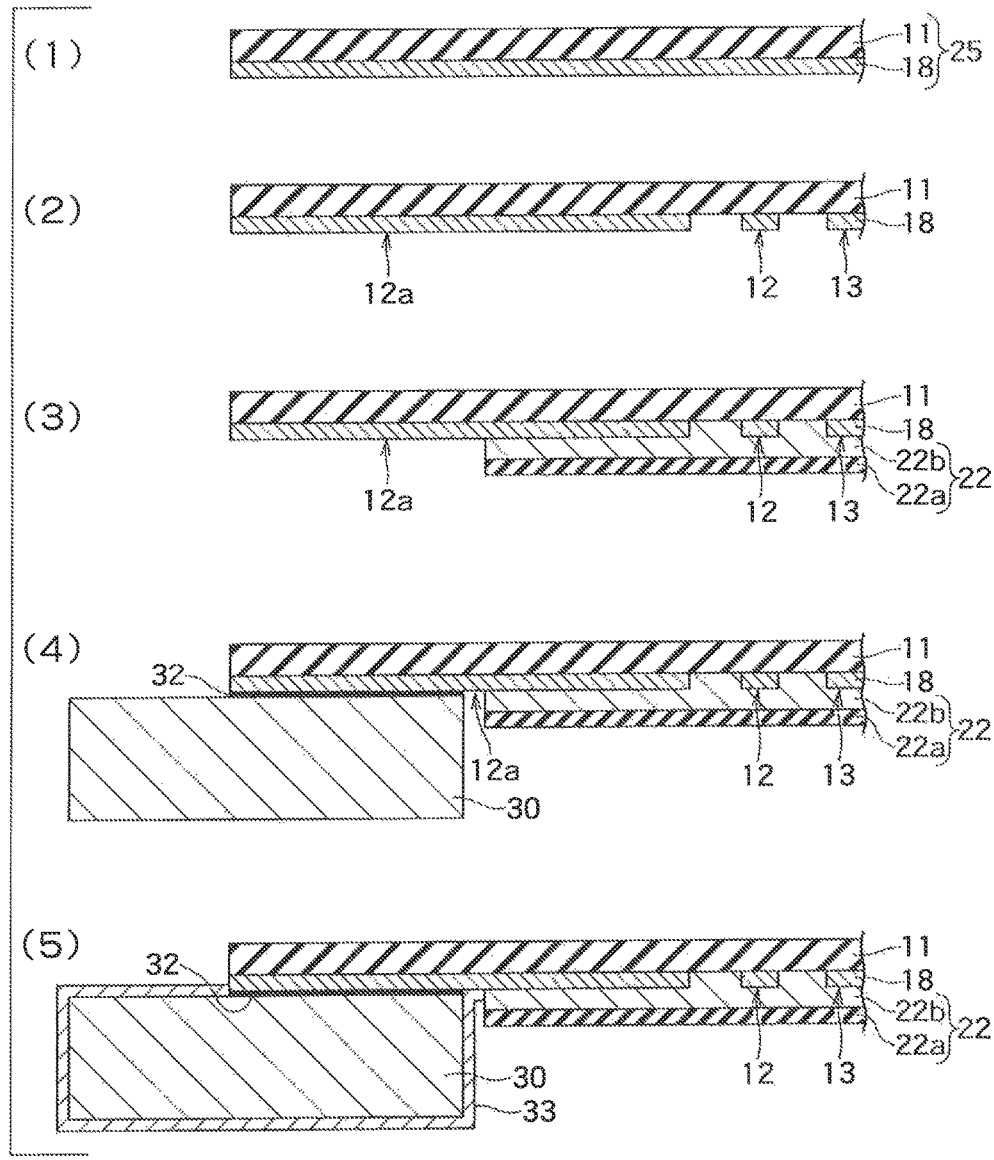
FIG. 6 is a process cross sectional view for describing a manufacturing method of a flexible printed circuit with bus bars, according to a modification of the first embodiment of the present invention.

First, as illustrated in FIG. 6(1), the one-sided metal-clad laminate 25 having the flexible insulating base material 11 and the metal film 18 provided on one main surface (lower surface) of the flexible insulating base material 11 is prepared. Also, the one-sided metal-clad laminate 25 is preferably a one-sided copper-clad laminate in which the metal film 18 is the copper foil.

Next, as illustrated in FIG. 6(2), the metal film 18 of the one-sided metal-clad laminate 25 is processed to form the flexible printed wiring board having the plurality of wiring patterns 12 and 13.

Then, as illustrated in FIG. 6(3), the wiring patterns 12 and 13 of the flexible printed wiring board are insulated and protected by the cover lay 22 so as to expose at least a part of the land part 12a for the bus bar connection.

Next, as illustrated in FIG. 6(4), the bus bar 30(29) is fixed to each of the land parts 12a for the bus bar connection.

Subsequently, as illustrated in FIG. 6(5), the electroplating treatment of the flexible printed wiring board to which the plurality of bus bars 30(29) are fixed is carried out, and the plating layer 33 is formed on the bus bar 30(29) and the exposed surface of the land part 12a for the bus bar connection. By the plating layer 33, the bus bars 29 and 30 and the land parts 12a for the bus bar connection are electrically connected in block.

Second Embodiment

Next, with reference to FIG. 7, an FPC 2 with bus bars according to a second embodiment of the present invention will be described. FIG. 7 illustrates a plan view of the FPC 2 with the bus bars according to the second embodiment.

In FIG. 7, the same reference symbols are attached to the same components as the first embodiment.

One of differences between the second embodiment and the first embodiment is the configuration and fixing method of the bus bars. Hereinafter, the second embodiment will be described with a focus on parts different from the first embodiment.

The FPC 2 with the bus bars is assembled to a battery block formed by laminating a plurality of battery cells 91 (14 pieces in FIG. 7), and is suitable for a fuel cell with the large number of cells for instance.

As illustrated in FIG. 7, the FPC 2 with the bus bars includes a flexible printed wiring board 10A, and a plurality of bus bars 34 and 35 fixed to the flexible printed wiring board 10A.

The flexible printed wiring board 10A includes the flexible insulating base material 11, and the wiring patterns 12 and 13 provided on one main surface (upper surface) of the flexible insulating base material 11.

Also, though the FPC 2 with the bus bars is not provided with the duplexed wiring pattern 15, the duplexed wiring pattern 15 may be provided on a lower surface of the flexible printed wiring board 10A in order to improve reliability.

The bus bar 34 is a short bus bar for connecting the battery cell 91 at one end of the battery block, and has one hole 36. The bus bar 35 is for electrically connecting electrodes of the adjacent battery cells 91 with each other, and has two holes 36. The bus bars 34 and 35 are formed of a material similar to the bus bars 29 and 30, and are fixed to the land part 12a for the bus bar connection with an adhesive.

The bus bars 34 and 35 have such a size that surface mounting can be performed to the flexible printed wiring board by a surface mounter (chip mounter). Preferably, as illustrated in FIG. 7, the bus bars 34 and 35 are smaller in a planar shape than the land part 12a for the bus bar connection.

The bus bars 34 and 35 are electrically connected to the respectively corresponding land parts 12a for the bus bar connection in block, by a plating layer (not shown in the figure) formed on the bus bars 34 and 35 and the land parts 12a for the bus bar connection.

When assembling the FPC 2 with the bus bars according this embodiment to the battery block, a bolt-like electrode of the battery cell 91 is inserted to the hole 36 and is fixed with a nut.

According to the second embodiment, effects similar to the first embodiment can be obtained. That is, assembly to the battery block is facilitated, and the entire battery system can be miniaturized and made light in weight. Further, by duplexing the wiring pattern, reliability can be improved. Also, by forming a fine wiring pattern, even a large number of battery cells can be easily coped with, and the flexible printed circuit with the bus bars can be miniaturized.

In addition, by this embodiment, since the bus bar is smaller than the land part for the bus bar connection, it is easy to cope with the battery block formed by laminating many small-sized battery cells like a fuel cell.

The FPC 2 with the bus bars according to this embodiment can be manufactured similarly to the manufacturing method described in the first embodiment, except for a fixing method of the bus bars. That is, in this embodiment, in the process of fixing the bus bars, the bus bars 34 and 35 are individually surface-mounted on the plurality of land parts 12a for the bus bar connection using a surface mounter. By using the surface mounter capable of high-speed mounting, productivity can be maintained even when the number of the bus bars is large.

Also, before surface-mounting the bus bars 34 and 35, a liquid adhesive is applied onto the land parts 12a for the bus bar connection using a coating apparatus such as a dispenser. Or, before performing surface mounting, the adhesive may be applied to back surfaces (surfaces to be abutted to the land parts 12a for the bus bar connection) of the bus bars 34 and 35.

(Modification of the Second Embodiment)

Then, a flexible printed circuit with bus bars according to a modification of the second embodiment will be described with reference to FIG. 8. FIG. 8 illustrates a plan view of an FPC 3 with bus bars according to this modification. In FIG. 8, the same reference symbols are attached to the same components as the first and second embodiments.

In this modification, by providing a part of the plurality of wiring patterns 13 for cell temperature measurement on a back surface of the flexible insulating base material 11, the size (horizontal width) of the flexible printed circuit with the bus bars is miniaturized.

The FPC 3 with the bus bars includes a flexible printed wiring board 10B, and the plurality of bus bars 34 and 35 fixed to the flexible printed wiring board 10B.

The flexible printed wiring board 10B includes the flexible insulating base material 11, the wiring patterns 12 provided on one main surface (upper surface) of the flexible insulating base material 11, and the wiring patterns 13 provided on both main surfaces (upper surface and lower surface) of the flexible insulating base material 11.

The wiring patterns 13 for measuring the temperature of the battery cell are alternately provided on the upper surface and the lower surface of the flexible insulating base material 11 in the view in a vertical direction in FIG. 8. All the temperature sensor mounting parts 13a are provided on the upper surface side of the flexible insulating base material 11, and the wiring patterns 13 provided on the lower surface of the flexible insulating base material 11 are electrically connected to the temperature sensor mounting parts 13a through a plating through-hole (not shown in the figure).

Also, the FPC 3 with the bus bars according to this modification can be manufactured similarly to the manufacturing method described in the second embodiment, except for a part related to formation of the wiring patterns 13 on the back surface of the flexible insulating base material 11. The wiring patterns 13 are formed on the back surface as follows. That is, similarly to the case of forming the plating through-hole 14 for the duplexed wiring patterns 15, the plating through-holes are formed near the land parts 12a for the bus bar connection.

Then, similarly to the case of forming the duplexed wiring patterns 15, the wiring patterns 13 connected with the plating through-holes may be formed on the back surface of the flexible insulating base material 11.

A person skilled in the art can arrive at additional effects and various modifications of the present invention, on the basis of the above descriptions, but the forms of the present invention are not limited to the individual embodiments/modifications described above. The components over the different embodiments/modifications may be appropriately combined. Various additions, changes, and partial deletions are possible in the range of not departing from the conceptual ideas and spirit of the present invention derived from contents defined in the claims and the equivalents thereof.

REFERENCE SIGNS LIST 1, 2, 3 Flexible printed circuit with bus bars
10, 10A, 10B Flexible printed wiring board
11 Flexible insulating base material
12 Wiring pattern (for cell voltage measurement)
12a Land part for bus bar connection
13 Wiring pattern (for cell temperature measurement)
13a Temperature sensor mounting part
14 Plating through-hole
15 Duplexed wiring pattern (for cell voltage measurement)
16 Attachment target part
17, 18 Copper foil
19 Double-sided metal-clad laminate
20 Through-hole for electrical conduction
21 Plating layer
21a Plating through-hole
22, 23 Cover lay
22a, 23a Insulating film
22b, 23b Adhesive layer
24 Opening
25 One-sided metal-clad laminate
29, 30 Bus bar
31 Hole
32 Adhesive layer
33 Plating layer
34, 35 (Surface mounting small-sized) bus bar
36 Hole
40 Bus bar frame
41, 42 Connection part
43 Frame part
44 Positioning hole
50 Micro-joint part
90, 91 Battery cell
A Chip mounting area
B Area
C Cutting line

The invention claimed is:

1. A flexible printed circuit with bus bars comprising:
a flexible printed wiring board having a flexible insulating base material, and a plurality of wiring patterns provided on one main surface of the flexible insulating base material and provided with land parts for bus bar connection at one end; and
a plurality of bus bars fixed to the respectively corresponding land parts for the bus bar connection with an adhesive, wherein
the bus bar is electrically connected to the land part for the bus bar connection by a first plating layer formed on the bus bars and the land parts for the bus bar connection,
and wherein the bus bar is electrically connected to the land part for the bus bar connection by plating through-holes formed a second plating layer which is formed on an inner wall of a through-hole for electrical conduction provided in the flexible insulating base material and a third plating layer which formed on the bus bar exposed in the through-hole for electrical conduction and connected to the second plating layer, no screw being passed through the through-hole for electrical conduction.

2. The flexible printed circuit with the bus bars according to claim 1, further comprising
a plurality of duplexed wiring patterns provided on the other main surface of the flexible insulating base material,
wherein
the respective duplexed wiring patterns are electrically connected to the land parts for the bus bar connection through plating through-holes provided on the flexible insulating base material at one end, and are electrically connected to the other end of the wiring patterns at the other end.

3. The flexible printed circuit with the bus bars according to claim 1, wherein the bus bar is smaller than the land part for the bus bar connection.

4. The flexible printed circuit with the bus bars according to claim 1,
provided with a land part for chip mounting on the other end of the wiring pattern, and
further comprising a semiconductor chip which is mounted on the land part for the chip mounting by solder and monitors a voltage of the wiring pattern.

5. A battery system comprising:
a battery block formed by laminating a plurality of battery cells; and
the flexible printed circuit with the bus bars according to claim 4, which is assembled to the battery block so that electrodes of the battery cells are electrically connected to the bus bars.

* * * * *